United States Patent [19]

Van den Sype

[11] Patent Number: 5,227,365
[45] Date of Patent: Jul. 13, 1993

[54] FABRICATION OF SUPERCONDUCTING METAL-OXIDE TEXTILES BY HEATING IMPREGNATED POLYMERIC MATERIAL IN A WEAKLY OXIDIZING ATMOSPHERE

[75] Inventor: Jaak S. Van den Sype, Scarsdale, N.Y.

[73] Assignee: Praxair Technology, Inc., Danbury, Conn.

[21] Appl. No.: 840,195

[22] Filed: Feb. 24, 1992

Related U.S. Application Data

[63] Continuation-in-part of Ser. No. 573,855, Aug. 28, 1990, abandoned.

[51] Int. Cl.$^5$ ............................................. H01L 39/12
[52] U.S. Cl. ..................................... 505/1; 505/785; 505/739; 505/740; 505/780; 252/509; 252/511; 252/521; 423/447.1; 423/447.5; 423/447.6; 423/593; 428/408; 428/902; 428/930; 264/29.6; 264/60
[58] Field of Search ............... 505/1, 739, 740, 780, 505/785; 252/521, 509, 511; 423/447.1, 447.5, 447.6, 593; 428/408, 902, 930; 264/29.6, 60

[56] References Cited

U.S. PATENT DOCUMENTS

| | | | |
|---|---|---|---|
| 3,663,182 | 5/1972 | Hamling | 23/355 |
| 3,860,529 | 1/1975 | Hamling | 252/301 |
| 4,104,395 | 8/1978 | Frankel | 264/60 |
| 4,537,818 | 8/1985 | Quinby | 428/262 |
| 4,983,573 | 1/1991 | Bolt et al. | 505/1 |
| 4,994,436 | 2/1991 | Giacobbe | 505/1 |
| 5,023,230 | 6/1991 | Cheng | 505/785 |

FOREIGN PATENT DOCUMENTS

| | | |
|---|---|---|
| 0101086 | 2/1984 | European Pat. Off. |
| 0351844 | 1/1990 | European Pat. Off. |
| 1103409 | 10/1987 | Japan |
| 63-295470 | 12/1988 | Japan |
| 2-116620 | 5/1990 | Japan |
| 2-167851 | 9/1990 | Japan |
| WO891924 | 3/1989 | PCT Int'l Appl. |

OTHER PUBLICATIONS

"The Fabrication of a Ceramic Superconducting Wire", M. A. Luck, et al., *Supercond. Sci. Technol.* 1, 137 (1988).

"Polymer Precursor Synthesis and Characterization of YBa$_2$Cu$_3$O$_{7-x}$", J. C. W. Chien, et al., *Physical Review B* 38, 11853 (1988).

"Preparation of High-Tc Y-BA-Cu-O Superconducting Filaments by Suspension Spinning Method", T. Goto and M. Kada, *Jap. Journ. Appl. Physics* 26, L1527 (1987).

"Fabrication of Dense Ba$_2$YCu$_3$O$_{7-x}$ Superconductor Wire by Molten Oxide Processing" S. Jin et al, *Appl. Phys. Lett.* 51, 943 (1987).

"Heat Treatment of Wires On the Basis of the High T$_c$ Superconductor YBa$_2$CU$_3$Ox", P. Miller et al, *Appl. Phys. Lett.* 55, 917 (1989).

"Superconductivity Up to 114°K in the Bi–Al–Ca–Sr–Cu–O Compound System Without Rare Earth Elements", C. W. Chu et al, *Physical Review Letters* 60, 941 (1988).

"Low Temperature Phase Relations and Decomposition of YBa$_2$CU$_3$O$_{6+x}$ Precursors", S. J. Keating et al, *Advanced Ceramic Materials*, 1988.

"Synthesis of High Quality 1-2-3 Compound Through Citrate Combustion", R. Pankajavalli et al, *Physica C* 156, 737 (1988).

"The Oxalate Route to Superconducting YBa$_2$CU$_3$O$_{7-x}$", X. Z. Wang et al, *Solid State Communications*, 64, 881 (1987).

"Superconducting Oxide Films with High Transition Temperature Prepared From Metal Trifluoroacetate Precursors", D. Gupta et al, *Appl. Phys. Lett.* 52, 2077, (1988).

Primary Examiner—Paul Lieberman
Assistant Examiner—Bradley A. Swope
Attorney, Agent, or Firm—Peter Kent

[57] ABSTRACT

Process for producing superconducting metal-oxide textiles comprising impregnating a preformed, organic textile material with metal compounds in a desired atomic ratio, heating the material in a weakly oxidizing atmosphere to pyrolize and oxidize the organic material, maintaining the material at temperature in an oxidizing atmosphere, and cooling the material in an oxidizing atmosphere, so as to form a crystalline structure capable of superconducting.

8 Claims, 1 Drawing Sheet

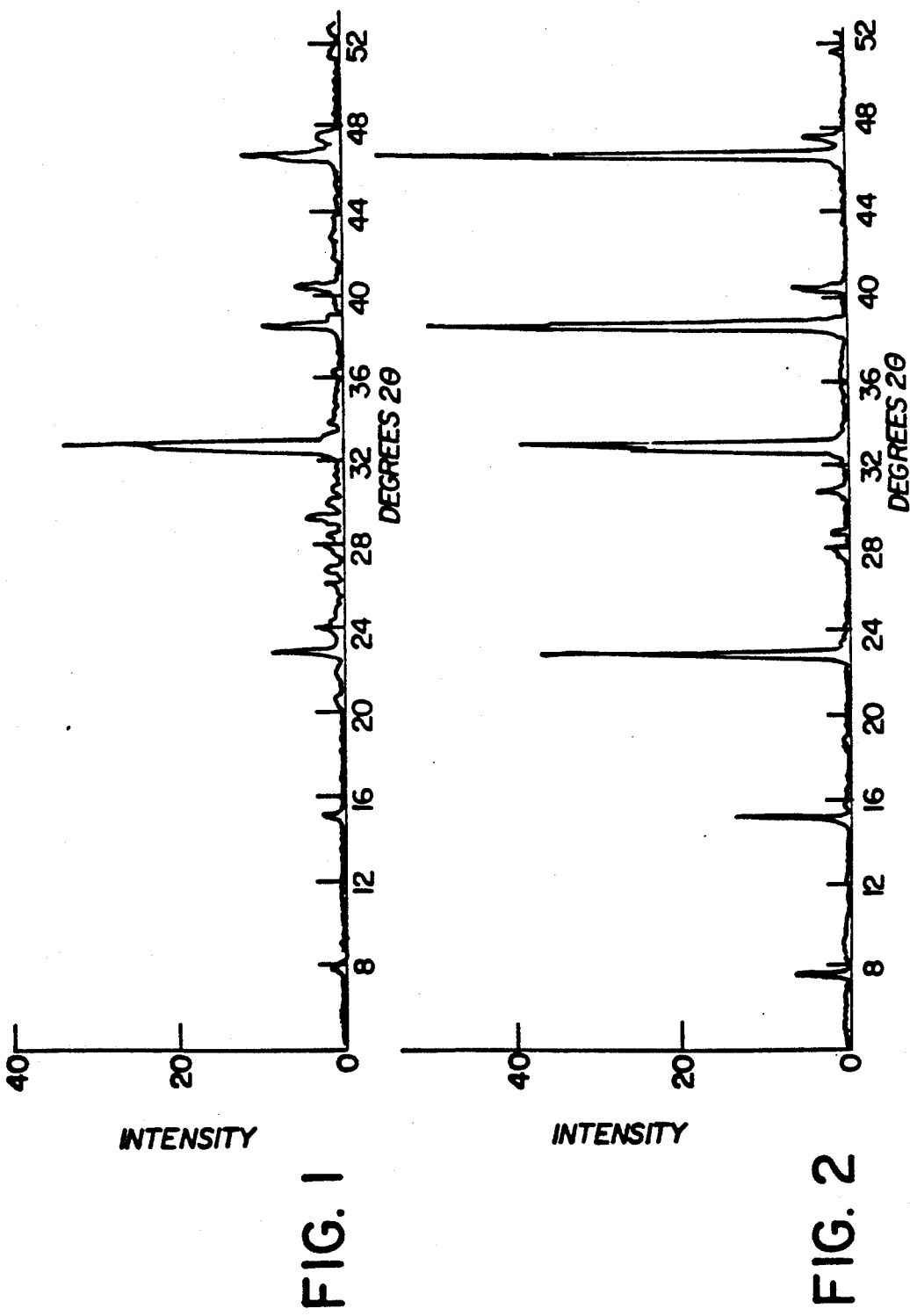

FABRICATION OF SUPERCONDUCTING METAL-OXIDE TEXTILES BY HEATING IMPREGNATED POLYMERIC MATERIAL IN A WEAKLY OXIDIZING ATMOSPHERE

This is a continuation-in-part of application Ser. No. 07/573,855 filed Aug. 28, 1990 now abandoned.

TECHNICAL FIELD

This invention pertains to fibers, textiles and shapes composed of superconductive metal oxides and to a process for their fabrication.

BACKGROUND

Superconductivity, the virtual disappearance of electrical resistivity, was initially discovered in mercury cooled to the boiling temperature of liquid helium. This discovery initiated the search for materials which would be superconductive at higher temperatures. In 1987 came a significant advance. Superconductivity was found at 95° K. in a material composed of several phases containing yttrium, barium, copper and oxygen. The discovery was significant in that the temperature at which superconductivity appeared was above the boiling temperature of liquid nitrogen, which could then be used for the cooling medium. The superconducting phase was found to correspond to the crystalline, orthorhombic oxide $YBa_2Cu_3O_7$. The superconductive property was lost, however, upon heating the orthorhombic phase under conditions where oxygen was depleted giving rise to a tetragonal phase, the composition of which was close to $YBa_2Cu_3O_6$. The transition seemed to occur around the composition $YBa_2Cu_3O_{6.5}$. Hence the superconductive property exists in compounds of the formula $YBa_2Cu_3O_{7-x}$ where x may vary from 0 to 0.4, the optimum being about 0.19.

Other high temperature superconductors which now have been identified include $YBa_2CuO_{7-x}$, $Ba_xLa_{5-x}$-$Cu_5O_{5(3-y)}$, $Bi_2Sr_2Cu_2O_{7+x}$, $Bi_4Sr_3Ca_3Cu_4O_x$, and $Tl_2Ca_2Ba_2Cu_3O_x$.

Superconductive metal oxide material can be produced by traditional ceramic techniques of grinding metal compounds in stoichiometric ratio to bring the metal compounds into proximity. Subsequent calcination allows the metal ions in their respective crystalline compounds to diffuse into the others. Repeated regrinding and calcination under controlled conditions produces the desired phase which has the superconductive property.

Most of the prospective applications of superconductors are based on the capability of transmitting electric power loss free, and on the production of powerful, compact magnets. Because motors and generators are based on magnetism, there is great potential for reducing their weights, sizes and inefficiencies. Powerful magnets are conceived to allow the suspension of objects such as a shaft in a bearing and a train over a track.

The superconductive metal oxides, like ceramics, are intrinsically brittle and their fabrication into useful shapes, even basic wire, presents many challenges. The most practiced method to date for the formation of superconductive wires has been the powder-in-tube technique. The superconductive material in powder form is packed into a silver, copper or stainless steel tube. The tube is then swaged and drawn, or rolled, down to a small diameter which can be further formed into a useful configuration.

Lusk et al. in Supercond. Sci. Technol. 1, 137 (1988) reported on the fabrication of a ceramic superconducting wire by an extrusion method. Superconductor precursor material in powder form was mixed with a binder such as epoxy resin, and the mixture was extruded into a wire form. The extrusion was heated in a nonreactive atmosphere to remove the binder, and then sintered at high temperature in air or oxygen to develop strength and the superconductive phase. Fragile wire with a diameter of about 0.8 mm resulted from this method.

The preparation of superconductive fibers by extruding or spinning a polymer-metal precursor was described by Chien et al. in Physical Review B, 38, 1953 (1988). Metal ions in the desired atomic ratios were complexed to a polymer. The polymer solution was extruded, dried and wound on a mandrel. Heating in nitrogen pyrolyzed the polymer, and subsequent heating in oxygen converted the metal intermediates to the superconductive oxide. The process produced fibers having diameters of 1 to 100 microns and grain sizes from 1 to 50 microns.

Jin et al. in Appl. Phys. Lett. 51, 943 (1987) described three different laboratory fabrications of $YBa_2Cu_3O_{7-x}$ wire by molten oxide processing. In the melt drawing technique, the center of a bar of $YBa_2Cu_3O_{7-x}$ material was fused with a laboratory blow torch flame, and the two unmelted ends pulled apart leaving a 1.2-mm diameter filament between them. In the melt spinning technique, one end of a bar of $YBa_2Cu_3O_{7-x}$ material was heated and a molten droplet allowed to fall on the outside of a rotating mandrel producing a ribbon 1.5 mm wide and 0.3 mm thick. Still another experiment employed a silver wire as a substrate onto which $YBa_2Cu_3O_{7-x}$ powder in a binder was deposited. The composite was dried, producing a 0.75-mm diameter composite wire containing an 0.25-mm diameter metal core. The wire was further processed by rapidly moving it through a torch flame and melting the outer portion. The wire formed in each of these three methods required a homogenizing heat treatment followed by an oxygen heat treatment to develop the superconductive phase. In production, any of these three techniques would require a high temperature melting furnace and precise control of operating variables.

The processes described above were all directed to the fabrication of a single filament. A process for producing metal oxide fibers, textiles and shapes was described by Hamling in U.S. Pat. No. 3,385,915. By textiles is meant a variety of textile forms including single filament, staple fibers, continuous tow and yarns, woven fabrics, batting and felts composed of fibers.

The Hamling process comprises initially impregnating a preform of organic polymeric textile material with one or more compounds of metals as desired in the final product. The impregnated material is heated under controlled conditions which prevent ignition of the organic material, but pyrolize the organic material to predominantly carbon and remove the carbon as a carbon-containing gas. The heating continues to oxidize the metal compounds. At least part of the heating is performed in the presence of an oxidizing gas. A product results which has substantially the same shape as the preform, but only about 40% to 60% of its original size. The metal oxide in the product typically is substantially micro-crystalline, or amorphous, that is, its crystallites are so small that they are barely discernible by conventional x-ray diffraction. This is indicative of a crystallite size on the order of 0.1 microns or less, which Hamling preferred for maximum strength in his product. The process, however, is described as capable of preparing fibers with crystallite sizes up to approximately 1 micron. With larger crystallite sizes, a significant loss in strength occurred. Mechanical properties of the product were impaired when the crystallite size exceeded approximately one-tenth the diameter of the fibers.

It is known that material capable of superconductive behavior must be in a crystalline state. Hence the process as described by U.S. Pat. No. 3,385,915 would not produce superconductive metal oxide.

Fabrics composed of metal oxides are described by Hamling in U.S. Pat. No. 3,663,182. Such fabrics are produced by the process described in U.S. Pat. No. 3,385,915, which has been summarized above. Hence, the fabric has all the characteristics of a product of that process, and would not be expected to have superconductive properties.

It is an object of the present invention to provide a process for producing superconducting metal oxide fibers, textiles and shapes. It is also an object to produce these products with flexibility and strength so as to allow their further shaping.

It is a feature of this invention that the starting material is organic polymeric material which can be preformed into the final product shape.

It is an advantage of this process that complicated and irregular product shapes can be produced from inexpensive organic materials which are readily preformed into the desired final shape. The preforming is inexpensive in that costly machining is unnecessary. Another advantage is that a high temperature melting furnace is not required.

SUMMARY OF THE INVENTION

The invention is a process for producing superconductive metal-oxide textiles. It comprises initially impregnating a preformed, organic, polymeric textile material with one or more compounds containing the desired metal elements in substantially the atomic ratios as occur in the superconductive material. The impregnated material is dried and heated in a controlled atmosphere to a temperature sufficiently high to pyrolize and oxidize the organic material and remove it as a carbon-containing gas. The heating is carried out without ignition of the organic and without melting the metal oxide. The material is then cooled at least partly in an oxidizing atmosphere to further oxidize and develop a crystalline superconductive metal oxide.

BRIEF DESCRIPTION OF THE DRAWINGS

FIG. 1 is the X-ray diffraction pattern obtained on a specimen of $YBa_2Cu_3O_{7-x}$ textile product by the process provided by this invention.

FIG. 2 is the X-ray diffraction pattern obtained on a specimen produced by grinding metal powders providing metal elements in the atomic ratios indicated in $YBa_2Cu_3O_{7-x}$ and sintering at 950° C. in oxygen.

DETAILED DESCRIPTION

The starting material in this invention can be any organic material capable of swelling and absorbing a solvent and not melting on heating during the subsequent processing. Any cellulosic material can be employed including rayon, saponified cellulose acetate, cotton, wool and ramie. Usable synthetics include acrylics, polyesters, vinyls and polyurethanes. Rayon is a preferred material because of its physical uniformity, high absorptivity and low impurity content.

The starting organic material is impregnated with compounds of metal elements to provide metal elements in the organic material in substantially the atomic ratios as are desired to appear in the product. When these compounds are salts highly soluble in water, the impregnation can be carried out by immersing the organic material in a concentrated aqueous solution of such salts in proper ratio. Alternatively, the organic material may be immersed sequentially in several solutions, each containing at least one of the desired compounds, thereby accumulating the desired metal content in the organic.

To obtain strength in the final product, it is desirable to impregnate the starting materials with metal compounds to the extent of at least 0.25 moles and preferably 1 to 2 moles of the metal compounds per base mole of cellulose. Base mole as used herein refers to the molecular weight of glycosidic unit of the cellulose chain, namely a molecular weight of 162. With non-cellulosic materials, the degree of impregnation should be at least 0.1 and preferably 0.5 to 1.0 gram-equivalent of metal per gram of organic material.

Water is the preferred solvent for metal compounds to impregnate cellulosic material. For impregnating vinyl and polyurethane materials, esters and ketones are suitable solvents. For impregnating acrylic and polyester materials, suitable solvents for the metal compounds include aromatic alcohols and amines such as aniline, nitro-phenol, meta-cresol and paraphenylphenol.

To increase the rate and extent of salt impregnation in cellulosic starting material, it may be preswelled by soaking in water prior to soaking in salt solution. For acrylic and polyester materials, aromatic alcohols are suitable swelling agents. For vinyl and polyurethane materials, ketones are useful.

An alternate method of impregnating the organic material is to use metal compounds which hydrolyze or react with water to form a metal oxide which is substantially insoluble in water. The selected compounds may be dissolved in an organic solvent immiscible with water, such as carbon tetrachloride, ether, or benzene, to the extent of 5 to 50 grams of metal compound per 100 ml of solvent. The starting organic material is prepared by exposing it to air having a relative humidity of between 50 to 90 percent. It absorbs 5 to 30 percent by weight of water and swells. In this swollen state, it is immersed in the prepared solution. As the metal compounds in the solution penetrate the swollen organic material, they react with the water, and the resultant oxide precipitates in the organic material structure. If the metal compound is a gas or liquid, the swollen starting organic material may be exposed directly to the gas or liquid to accomplish the precipitation of metal oxide.

Without being bound by the following theory regarding impregnation, organic polymeric materials such as cellulose, which are preferred starting materials for this process, are composed of small crystallites of polymer chains held together in a matrix of amorphous polymer. Upon immersion of the organic polymer in a prepared solution of metal salts, the amorphous regions absorb solution and enlarge or swell. The swollen amorphous regions then comprise 50 to 90 percent of the volume of the swollen organic. When the swollen organic is removed from the impregnating solution and dried, as by evaporation of the solvent, the metal compounds remain in the amorphous regions. The amorphous regions are so small, about 50 angstroms in size in cellulosic material, that the metal compounds do not crystallize.

After withdrawing the starting organic material from the impregnating solution, it is necessary to remove excess solution adhering to the surface of the starting material before this solution dries. Fibers bonded together by dried salt are likely to be similarly bonded in the final oxide product and cause reduced strength and increased brittleness. Excess solution can be removed by blotting the impregnated material with adsorbent paper or cloth using moderate pressure to press out excess solution from the material. Alternatively, washing, blowing with a gas stream, vacuum filtration or centrifugation may be employed.

Next, the impregnated material is dried by any convenient means such as a warm gas stream. Rapid drying is desirable to avoid migration of salt from the interior to the surface of the impregnated material. A drying time of one hour or less is preferred. The drying can also be accomplished during the first portion of the heating step which is described following.

The next principal step is to heat the impregnated organic material under controlled conditions to pyrolize the organic structure, eliminate the carbon and convert the metal compounds to the desired metal oxide. Pyrolysis is defined as chemical change brought about by the action of heat. Ignition and uncontrolled temperature rise of the organic material during the heating is to be avoided. Otherwise the organic material may disintegrate before the metal compounds have sintered together sufficiently to maintain the structural integrity of the working material. Also excessive crystallization and grain growth may occur resulting in excessive loss of strength in the final product.

Ignition and uncontrolled temperature rise may be avoided by heating at a moderate, controlled rate to a desired maximum temperature in an atmosphere of not more than weakly oxidizing capability. The maximum temperature will fall in the range from 500° C. to 1000° C., and will depend on the particular superconducting material desired and the treatment necessary to develop the appropriate oxidation state. The heating may be performed by suspending the impregnated material in a furnace having walls which are raised in temperature at a controlled rate. By radiation from the walls and convection from the furnace atmosphere heat is transferred to the impregnated material so that its temperature approximates the furnace wall temperature. Ignition and uncontrolled temperature rise would be a temperature rise in the impregnated material above the temperature of the furnace walls.

Heating rates of 60° C. to 600° C. per hour have been suitable. Heating rates at the low end of this range are preferred in heating to about 400° C., during which interval most of the pyrolysis of the organic will occur. By pyrolysis is meant chemical change brought about by the action of heat and with little oxidation. By oxidation is meant chemical change which involves combination with oxygen. At temperatures higher than 400° C., heating rates at the higher end of the range are preferred. A suitable atmosphere of weakly oxidizing capability was found to be carbon dioxide. Operative are atmospheres containing nonreactive gases with carbon dioxide, preferably in excess of 50% carbon dioxide, e.g., from about 55% to about 100% carbon dioxide; and preferably from about 70% to about 100% carbon dioxide.

Other weakly oxidizing atmospheres may be employed such as nitrous oxide, nitrogen dioxide or sulfur trioxide, mixtures of two or more thereof and mixtures of two or more thereof with nonreactive gases. In an atmosphere containing nitrous oxide, concentrations in excess of 10% nitrous oxide are operative, e.g., from about 20% to about 100% nitrous oxide.

Alternatively usable is a nonreactive gas containing a small percentage of oxygen, e.g., nitrogen, argon, or helium containing several percent of oxygen. The oxygen content appropriate will depend somewhat on the heating rate employed, weaker oxidizing atmospheres in general allowing somewhat faster heating rates. Oxygen contents up to 2% by volume are operative, from about 0.05 to about 1% are preferred and from 0.05% to about 0.5% are most preferred. Above the critical content of 2% oxygen, ignition and disintegration of the impregnated material was found to occur.

An atmosphere which is totally non-oxidizing is not suitable during the heating step because carbon is then apparently entrapped in the metal oxide, is not sufficiently removed, and is deleterious to the formation of the superconducting phase.

During the heating step, if ignition is avoided, consolidation of the metal compounds occurs which is evident as shrinkage of the starting preform material. Typically, the longest dimension of the starting material shrinks 40% to 60%. In general, the shrinkage is inversely proportional to the degree of impregnation of metal compounds achieved in the starting material.

Particularly in the case of string or tape-like starting materials, it has been desirable to apply a light tension to the starting material during the heating step. This tension serves to reduce wrinkling or warpage of the material.

Upon reaching the selected maximum temperature in the weakly oxidizing atmosphere, these conditions are maintained until the reaction activity approaches completion as evident by the reduction in evolution of gases from the starting organic. At this stage the pyrolysis of the starting material is substantially complete, and oxidation of the carbon has at least begun.

The next step is to convert to and maintain a mildly oxidizing atmosphere while approximately maintaining temperature, until the oxidation and removal of the carbon as a gas has approached completion at these conditions. A mildly oxidizing atmosphere can be conveniently provided as a slowly flowing nonreactive gas such as nitrogen, argon, or helium containing from 0.5% to 5% of oxygen by volume. The approach of reaction completion can be determined by observing the decrease and leveling off of the carbon dioxide content in the effluent to a small value, such as 0.5%, which has been observed to occur in from 0.5 to 2 hours.

At this point, the atmosphere is converted to at least a moderately oxidizing atmosphere, which will further gasify the remaining carbon and at least partially form the desired oxidation state in the working material. Such atmospheres will contain at least 20% oxygen and preferably substantially oxygen. In some instances, ozone with its greater oxidizing power may be advantageous. These conditions are maintained at least for 0.5 hours and preferably for 5 hours.

Cooling may be performed in the latter atmosphere, and preferably in an atmosphere of substantially oxygen. Cooling while the working material is still at high temperature must be performed in an atmosphere which will add oxygen to the working material, i.e., form or develop the superconductive oxide, and not remove oxygen from the working material, i.e., maintain the oxygen content. The cooling rate may be in the range of 60° C. to 600° C. per hour. During the cooling, the material is preferably in the established oxidizing atmosphere for a time of 0.5 to 5 hours while in the temperature range of 700° to 400° C. Such treatment is favorable for the development of the oxidation state which is superconducting.

EXAMPLE

Following is an example of the preparation of a superconducting tape of $YBa_2Cu_3O_{7-x}$ pursuant to the process of this invention. A solution was prepared by dissolving 4 grams of $Y(NO_3)_3 \cdot 6H_2O$, 6 grams of $Ba(NO_3)_2$ and 8.4 grams of $Cu(NO_3)_3 \cdot 3H_2O$ into 100 cc of distilled water at 60° C. This concentration was near the highest achievable, insasmuch as $Ba(NO_3)_2$, the least soluble of the three salts, would precipitate at lower temperatures. A rayon tape 1.25 inch wide, 0.018 inch thick, approximately 12 inches long, with individual fibers 0.001 inch in diameter was soaked for 4 hours in this solution. Excess solution was pressed out by rolling the tape between sheets of absorbing paper. About 10% by weight of salts in the tape was achieved on a dry basis.

The imbibed tape under slight tension of 50 grams was heated in a furnace at a rate between 60° C. to 600° C. per hour to 850° C. in a flowing atmosphere of carbon dioxide gas.

It was found that to form the desired $YBa_2Cu_3O_{7-x}$ compound, the precursor tape had to be heated to at least 750° C. and preferably to 850° C. Above 950° C., fracture of the precursor tape commonly occurred, apparently because of partial melting of the metal oxides. At temperatures above 950° C., a molten peritectic region exists with compositions that extend close to the desired $YBa_2Cu_3O_{7-x}$ compound.

Experimentation with nitrogen during the heating step was also conducted, but did not produce the desired superconducting product. Pyrolysis of the starting organic material in a totally nonoxidizing atmosphere apparently caused entrapment of carbon in the resulting metal oxide which was detrimental to the formation of the superconducting oxide. Pyrolysis in air caused the impregnated tape to ignite and disintegrate apparently because the rayon fibers lost their structural integrity before the metal oxides had sintered together sufficiently. Carbon dioxide gas for the initial heating phase, where pyrolysis occurs, proved to be an acceptable atmosphere which avoided ignition yet allowed the oxidation and elimination of carbon.

Upon reaching 850° C. in the carbon dioxide atmosphere, these conditions were maintained for 1.5 hours. The atmosphere was then changed to nitrogen containing 1% oxygen and maintained for 18 hours. By this time, the carbon dioxide content in the exiting gas had decreased to less than 0.5% indicating that the pyrolysis and carbon elimination reactions had approached completion. The atmosphere was then changed to 100% oxygen and maintained for 1 to 2 hours. Then the tape was slowly cooled to 450° C. at a rate of about 60° C. per hour in oxygen. Below 450° C. the tape was cooled rapidly to room temperature while the oxygen flow was maintained.

The product tape typically was 0.4 inches wide and 4 inches long with individual fibers approximately 0.0004 inches in diameter. By chemical analysis, the tape composition was 16.67 atom % Y, 33.33% Ba and 50.18% Cu which compared favorably with the ideal composition of 16.767% Y, 33.67 Ba and 50.00% Cu. Observed under a microscope, the tape had a morphology characteristic of the starting rayon tape.

X-ray diffraction of the product tape displayed well-defined peaks characteristic of superconducting orthorhombic $YBa_2Cu_3O_{7-x}$ as shown in FIG. 1. However, the relative magnitudes of the peaks differed from the relative magnitudes of orthorhombic $YBa_2Cu_3O_{7-x}$ prepared by the traditional ceramic route of grinding and sintering of solid starting materials as shown in FIG. 2. This indicates that a degree of orientation of crystal axes had occurred in the crystallites comprising the product tape compared to the random orientation occurring in the ground and sintered material.

Although the invention has been described with a degree of particularity, the present disclosure has been made only by way of example, and numerous changes in the details and arrangement of various steps in the process may be resorted to without departing from the spirit and scope of the invention as hereinafter claimed.

I claim:

1. A process for producing crystalline fibers, textiles or shapes comprised of $YBa_2Cu_3O_{7-x}$ where x varies from about 0 to about 0.4, said process comprising:
   (a) impregnating a preformed organic polymeric material with three metal compounds to provide metal elements in said material in substantially the atomic ratio occurring in said $YBa_2Cu_3O_{7-x}$;
   (b) heating said impregnated material in a weakly oxidizing atmosphere containing from about 0.05% to about 2% oxygen by volume to a temperature sufficiently high to at least partially pyrolize and oxidize said organic material and at least partially oxidize said metal compounds substantially without ignition of said organic material and without formation of a molten phase or reaching a decomposition temperature of said $YBa_2Cu_3O_{7-x}$; and
   (c) cooling the resulting material in at least a moderately oxidizing atmosphere to room temperature so as to obtain said fibers, textiles or shapes.

2. A process for producing crystalline fibers, textiles or shapes comprised of $YBa_2Cu_3O_{7-x}$ where x varies from about 0 to about 0.4, said process comprising:
   (a) impregnating a preformed organic polymeric material with three metal compounds to provide metal elements in said material in substantially the atomic ratio occurring in said $YBa_2Cu_3O_{7-x}$;
   (b) heating said impregnated material in a weakly oxidizing atmosphere containing nitrogen dioxide or sulfur trioxide or mixtures thereof to a temperature sufficiently high to at least partially pyrolize and oxidize said organic material and at least partially oxidize said metal compounds substantially without ignition of said organic material and without formation of a molten phase or reaching a decomposition temperature of said $YBa_2Cu_3O_{7-x}$; and
   (c) cooling the resulting material in at least a moderately oxidizing atmosphere to room temperature so as to obtain said fibers, textiles or shapes.

3. A process for producing crystalline fibers, textiles or shapes comprised of $YBa_2Cu_3O_{7-x}$ where x varies from about 0 to about 0.4, said process comprising:
   (a) impregnating a preformed organic polymeric material with three metal compounds to provide metal elements in said material in substantially the atomic ratio occurring in said YBa$_2$Cu$_3$O$_{7-x}$;

(b) heating said impregnated material in a weakly oxidizing atmosphere containing carbon dioxide, nitrous oxide, nitrogen dioxide or sulfur trioxide or mixtures of two or more thereof to a temperature sufficiently high to at least partially pyrolize and oxidize said organic material and at least partially oxidize said metal compounds substantially without ignition of said organic material and without formation of a molten phase or reaching a decomposition temperature of said YBa$_2$Cu$_3$O$_{7-x}$; and (c) cooling the resulting material in at least a moderately oxidizing atmosphere to room temperature so as to obtain said fibers, textiles or shapes.

4. The process as in claim 3 wherein said weakly oxidizing atmosphere contains nitrogen dioxide, suflur trioxide, in excess of 50% by volume of carbon dioxide or in excess of 10% by volume of nitrous oxide or mixtures of two or more thereof.

5. The process as in claim 4 wherein said heating step comprises:

heating said material to a temperature between about 350° C. and 1000° C. in said weakly oxidizing atmosphere;

maintaining said material at said temperature condition and atmosphere condition until reaction activity approaches completion;

subsequently maintaining said material at said temperature condition in an atmosphere containing from about 0.5% to about 5% by volume oxygen until reaction activity approaches completion;

subsequently maintaining said material at said temperature condition in an atmosphere containing at least 20% by volume oxygen until reaction activity approaches completion; and said cooling step comprises maintaining said material in the temperature range of 700° C. to 400° C. in an atmosphere of at least 20% by volume oxygen for at least one-half hour.

6. A textile produced in accordance with the process of claim 4.

7. The textile as in claim 6 wherein said fibers have a textile morphology and a diameter in the range of from about one to about twenty-five micrometers.

8. The textile as in claim 6 further comprising material having an X-ray diffraction pattern with peaks substantially at angles and substantially with relative magnitudes as in FIG. 1.

* * * * *